United States Patent
Weiser et al.

(10) Patent No.: US 8,685,595 B2
(45) Date of Patent: *Apr. 1, 2014

(54) PREPOLYMER-BASED POLYURETHANE FORMULATIONS FOR THE PRODUCTION OF HOLOGRAPHIC FILMS

(75) Inventors: Marc-Stephan Weiser, Leverkusen (DE); Thomas Rölle, Leverkusen (DE); Friedrich-Karl Bruder, Krefeld (DE); Thomas Fäcke, Leverkusen (DE); Dennis Hönel, Zülpich (DE)

(73) Assignee: Bayer MaterialScience AG, Leverkusen (DE)

( * ) Notice: Subject to any disclaimer, the term of this patent is extended or adjusted under 35 U.S.C. 154(b) by 894 days.

This patent is subject to a terminal disclaimer.

(21) Appl. No.: 12/704,571

(22) Filed: Feb. 12, 2010

(65) Prior Publication Data

US 2010/0203241 A1 Aug. 12, 2010

(30) Foreign Application Priority Data

Feb. 12, 2009 (EP) .................................... 09001951

(51) Int. Cl.
| | |
|---|---|
| *G03H 1/02* | (2006.01) |
| *G11B 7/245* | (2006.01) |
| *G03F 7/028* | (2006.01) |
| *C08G 18/10* | (2006.01) |
| *C08G 18/78* | (2006.01) |
| *C08G 18/67* | (2006.01) |
| *C08G 18/77* | (2006.01) |
| *C08G 18/48* | (2006.01) |
| *C08G 18/79* | (2006.01) |

(52) U.S. Cl.
CPC ..... *G03H 1/0248* (2013.01); *G03H 2001/0264* (2013.01); *G03H 2260/12* (2013.01); *G03F 7/028* (2013.01); *C08G 18/10* (2013.01); *C08G 18/67* (2013.01); *C08G 18/77* (2013.01); *C08G 18/48* (2013.01); *C08G 18/79* (2013.01)
USPC ....................................... 430/1; 430/2; 359/3

(58) Field of Classification Search
None
See application file for complete search history.

(56) References Cited

U.S. PATENT DOCUMENTS

| | | | |
|---|---|---|---|
| 6,090,939 A * | 7/2000 | Richter et al. .................. | 544/67 |
| 6,743,552 B2 | 6/2004 | Setthachayanon et al. | |
| 6,765,061 B2 | 7/2004 | Dhar et al. | |

(Continued)

FOREIGN PATENT DOCUMENTS

| | | |
|---|---|---|
| EP | 0223587 A1 | 5/1987 |
| EP | 1002817 A2 | 5/2000 |

(Continued)

OTHER PUBLICATIONS

Bayer MaterialScience, "Products and Properties, Baycoll, Desmodur, Desmophen for reactive adhesives, Commercial and trial products",. 20 pages (May 2006).*

(Continued)

*Primary Examiner* — Martin Angebranndt
(74) *Attorney, Agent, or Firm* — Novak Druce Connolly Bove + Quigg LLP

(57) ABSTRACT

The present invention relates to a novel holographic photopolymer based on prepolymer-based polyurethane compositions, the preparation of said photopolymer and its use for a very wide range of optical applications.

13 Claims, 2 Drawing Sheets

(56) References Cited

U.S. PATENT DOCUMENTS

| | | |
|---|---|---|
| 6,780,546 B2 | 8/2004 | Trentler et al. |
| 8,361,678 B2 * | 1/2013 | Weiser et al. ............ 430/1 |
| 2006/0194120 A1 | 8/2006 | Cole et al. |
| 2008/0311482 A1 * | 12/2008 | Stockel et al. ............ 430/2 |
| 2008/0311483 A1 * | 12/2008 | Stockel et al. ............ 430/2 |
| 2008/0312403 A1 * | 12/2008 | Stockel et al. ............ 528/59 |
| 2010/0086860 A1 * | 4/2010 | Roelle et al. ............ 430/2 |
| 2010/0086861 A1 * | 4/2010 | Weiser et al. ............ 430/2 |
| 2010/0087564 A1 * | 4/2010 | Weiser et al. ............ 522/95 |
| 2010/0112459 A1 * | 5/2010 | Weiser et al. ............ 430/2 |
| 2011/0065827 A1 * | 3/2011 | Facke et al. ............ 522/173 |
| 2011/0207029 A1 * | 8/2011 | Hagen et al. ............ 430/2 |
| 2011/0311905 A1 * | 12/2011 | Honel et al. ............ 430/2 |
| 2011/0311906 A1 * | 12/2011 | Rolle et al. ............ 430/2 |

FOREIGN PATENT DOCUMENTS

| | | |
|---|---|---|
| WO | WO-03/014178 A1 | 2/2003 |
| WO | WO-03/023520 A2 | 3/2003 |
| WO | WO-2008/125199 A1 | 10/2008 |

OTHER PUBLICATIONS

Munstock et al., "New low viscous polyisocyanates for VOC compliant systems", Macromol. Symp., vol. 187 pp. 3-14 (2002).*

* cited by examiner

PREPOLYMER-BASED POLYURETHANE FORMULATIONS FOR THE PRODUCTION OF HOLOGRAPHIC FILMS

RELATED APPLICATIONS

This application claims benefit to European Patent Application No. 09001951.4, filed Feb. 12, 2009, which is incorporated herein by reference in its entirety for all useful purposes.

BACKGROUND OF THE INVENTION

The present invention relates to a novel holographic photopolymer based on prepolymer-based polyurethane compositions, the preparation of said photopolymer and its use for a very wide range of optical applications.

Holographic media can be used, inter alia, as a data store, in the area of security technology (for example of the three-dimensional representation of persons or objects and the authentification of a person or of an article), the representation of objects, use as an advertising medium, use as auxiliary materials for the production of complex three-dimensional structures and as a screen or as components of screen parts and for the production of an optical element having the function of a lens, of a mirror, of a filter, of a diffusion screen, of a diffraction element, of a light conductor and/or of a mask.

Holographic media based on a polymer matrix and one or more compounds embedded therein and capable of radical polymerization, as writing monomers, are described, for example, in U.S. Pat. No. 6,743,552.

U.S. Pat. No. 6,743,552, U.S. Pat. No. 6,765,061, U.S. Pat. No. 6,780,546 and US 2006/0194120 disclose such two-component polyurethane formulations. Some of the formulations described there contain prepolymers as an isocyanate component, these being exclusively prepolymers having secondary isocyanate groups and therefore being unsatisfactory in the curing rate.

Polymer formulations for the production of holographic media were described, inter alia, in the non-prior-published patent applications EP 08017279.4, EP 08017277.8, EP 08017273.7, EP 08017275.2. EP 08017277.8 and EP 08017273.7 describe polyether-based and prepolymer-based polyurethane compositions which in general are suitable for the production of holographic media. EP 08017275.2 described polyurethane formulations comprising specific acrylates, which are suitable for recording holograms. Furthermore, EP 08017279.4 described for the first time a typical film structure and the application of various polyurethane formulations as a photopolymer in the film composite. The use of prepolymer-based polyurethane formulations for a coated film with the combination of a dye/initiator mixture which covers the complete visible wavelength spectrum (400-800 nm) has on the other hand not been previously described.

It was an object of the present invention to provide polyurethane compositions from which it is possible to prepare holographic photopolymers having good surface quality and processability, which also have a good refractive index contrast.

Embodiment of the Invention

An embodiment of the present invention is a polyurethane composition comprising
  A) a polyisocyanate component comprising an NCO-terminated polyurethane prepolymer, wherein the NCO groups of said NCO-terminated polyurethane prepolymer are primarily aliphatically bonded and wherein said NCO-terminated polyurethane prepolymer is based on hydroxy-functional compounds having an OH functionality of from 1.6 to 2.05;
  B) an isocyanate-reactive polyetherpolyol;
  C) a urethane acrylate and/or urethane methacrylate comprising at least one aromatic structural unit and a refractive index of greater than 1.50 at 405 nm, wherein said urethane acrylate and/or urethane methacrylate is free of NCO groups and OH groups;
  D) a free radical stabilizer;
  E) a photoinitiator based on a combination of a borate salt and a dye having an absorption band which at least partly covers the spectral range of from 400 to 800 nm;
  F) optionally a catalyst; and
  G) optionally an auxiliary and/or an additive.

Another embodiment of the present invention is the above polyurethane composition, wherein said NCO-terminated polyurethane prepolymer comprises one or more urethane, allophanate, biuret, and/or amide groups.

Another embodiment of the present invention is the above polyurethane composition, wherein said NCO-terminated polyurethane prepolymer is a urethane or allophanate of an aliphatic isocyanate-functional compound and an oligomeric or polymeric polyol, wherein said urethane or allophanate has a number average molar mass in the range of from 650 to 8200 g/mol and an NCO functionality of from 2.0 to 3.2 or of from 3.9 to 4.2.

Another embodiment of the present invention is the above polyurethane composition, wherein said NCO-terminated polyurethane prepolymer is an allophanate of HDI and a difunctional polyetherpolyol, wherein said allophanate has number average molar mass in the range of from 1900 to 4100 g/mol and an NCO functionality of from 2.0 to 3.2 or of from 3.9 to 4.2.

Another embodiment of the present invention is the above polyurethane composition, wherein said NCO-terminated polyurethane prepolymer has a residual content of free monomeric isocyanate of less than 0.5% by weight.

Another embodiment of the present invention is the above polyurethane composition, wherein B) comprises a poly(propylene oxide), a poly(ethylene oxide), or a combination thereof in the form of random or block copolymers.

Another embodiment of the present invention is the above polyurethane composition, wherein B) comprises a difunctional polyetherpolyol based on propylene oxide and ethylene oxide, wherein the proportion of ethylene oxide is less than 10% by weight, based on the total weight of said polyetherpolyol, and wherein said difunctional polyetherpolyol has a number average molar mass in the range of from 2000 to 4200 g/mol.

Another embodiment of the present invention is the above polyurethane composition, wherein said urethane acrylate and/or urethane methacrylate has a refractive index $n_D^{20}$ of greater than 1.55.

Another embodiment of the present invention is the above polyurethane composition, wherein said urethane acrylate and/or urethane methacrylate is based on (1) an aromatic isocyanate and (2) 2-hydroxyethyl acrylate, hydroxypropyl acrylate, 4-hydroxybutyl acrylate, a polyethylene oxide mono(meth)acrylate, a polypropylene oxide mono(meth)acrylate, a polyalkylene oxide mono(meth)acrylate, or a poly(ε-caprolactone) mono(meth)acrylate.

Another embodiment of the present invention is the above polyurethane composition, wherein E) is a mixture of E1) and E2, wherein E1) is selected from the group consisting of tetrabutylammonium tetrahexylborate, tetrabutylammonium triphenylhexylborate, tetrabutylammonium tris(3-fluorophenyl)hexylborate, and tetrabutylammonium tris(3-chloro-4-methylphenyl)hexylborate and E2) is selected from the group consisting of Astrazon Orange G, methylene blue, new methylene blue, azure A, pyrillium I, safranin O, cyanine, gallocyanine, brilliant green, crystal violet, ethyl violet, and thionine.

Yet another embodiment of the present invention is a process for producing a medium for recording visual holograms comprising applying the above polyurethane composition to a substrate or in a mould and curing said polyurethane composition.

Yet another embodiment of the present invention is a medium for recording visual holograms produced by the above process.

Yet another embodiment of the present invention is an optical element or image comprising the above medium.

DESCRIPTION OF THE INVENTION

Figure 1:
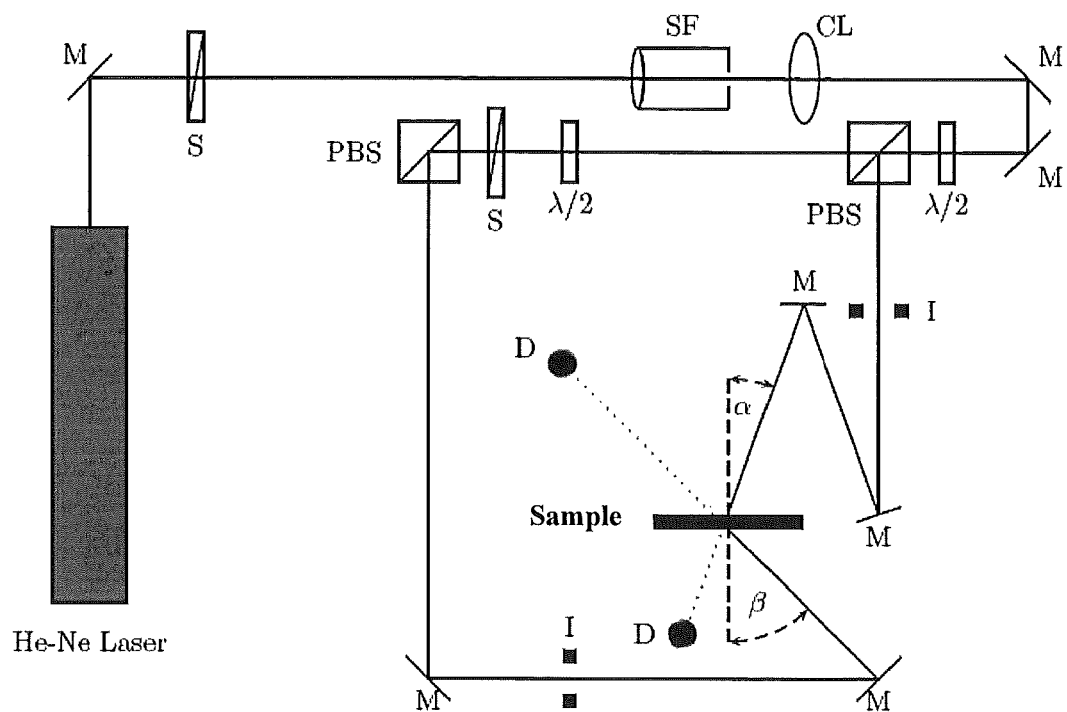
FIG. 1 depicts the geometry of a holographic media tester at λ=633 nm (He—Ne laser) for writing a reflection hologram.

It has now surprisingly been found that the abovementioned requirements can be met if prepolymer-based polyurethane compositions are used in combination with certain polyether polyols as matrix materials and specific urethane acrylates having a high refractive index and at least one aromatic structural unit are used as writing monomers.

The invention therefore relates to polyurethane compositions comprising

A) a polyisocyanate component, at least containing an NCO-terminated polyurethane prepolymer whose NCO groups are primarily aliphatically bonded and which is based on hydroxy-functional compounds having an OH functionality of 1.6 to 2.05,
B) isocyanate-reactive polyetherpolyols
C) urethane acrylates and/or urethane methacrylates having at least one aromatic structural unit and a refractive index greater than 1.50 at 405 nm, which themselves are free of NCO groups and OH groups,
D) free radical stabilizers
E) photoinitiators based on combinations of borate salts and one or more dyes having absorption bands which at least partly cover the spectral range from 400 to 800 nm
F) optionally catalysts
G) optionally auxiliaries and additives.

The prepolymers of components A) which are essential to the invention are obtained in a manner well known per se to the person skilled in the art by reacting monomeric, oligomeric or polyisocyanates A1) with isocyanate-reactive compounds A2) in suitable stoichiometry with optional use of catalysts and solvents.

In this way, NCO-functional prepolymers having urethane, allophanate, biuret and/or amide groups can be prepared.

Suitable polyisocyanates A1) are all aliphatic, cycloaliphatic, aromatic or araliphatic di- and triisocyanates known per se to the person skilled in the art, it being unimportant whether these were obtained by means of phosgenation or by phosgene-free processes. In addition, the higher molecular weight secondary products of monomeric di- and/or triisocyanates having a urethane, urea, carbodiimide, acylurea, isocyanurate, allophanate, biuret, oxadiazinetrione, uretdione or iminooxadiazinedione structure which are well known per se to the person skilled in the art, can also be used, in each case individually or in any desired mixtures.

Preferred monomeric di- or triisocyanates which can be used as component A1) are butylene diisocyanate, hexamethylene diisocyanate (HDI), isophorone diisocyanate (IPDI), trimethylhexamethylene diisocyanate (TMDI) and/or isocyanatomethyl-1,8-octane diisocyanate (TIN). TIN, TMDI and HDI are particularly preferred and HDI is very particularly preferred.

OH-functional compounds having an OH functionality of, preferably 1.9 to 2.01, particularly preferably 2.0, are used as isocyanate-reactive compounds A2) for the synthesis of the prepolymers.

Oligomeric or polymeric isocyanate-reactive compounds of the abovementioned functionality range, such as low molecular weight short-chain aliphatic, araliphatic or cycloaliphatic diols, i.e. containing 2 to 20 carbon atoms, are suitable for this purpose. Examples of such diols are ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butylpropanediol, trimethylpentanediol, positional isomers of diethyloctanediol, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclohexyl)propane), 2,2-dimethyl-3-hydroxypropyl 2,2-dimethyl-3-hydroxypropionate.

Relatively high molecular weight aliphatic and cycloaliphatic polyols of the abovementioned functionality range, such as polyesterpolyols, polyetherpolyols, polycarbonatepolyols, hydroxy-functional acrylic resins, hydroxy-functional polyurethanes, hydroxy-functional epoxy resins or corresponding hybrids are also suitable.

For example, the difunctional polyadducts of ethylene oxide, propylene oxide, tetrahydrofuran, butylene oxide, and their mixed adducts and graft products, and the polyetherpolyols obtained by condensation of dihydric alcohols or mixtures thereof and the polyetherpolyols obtained by alkoxylation of dihydric alcohols may be as such polyetherpolyols. Preferred difunctional polyetherpolyols are poly(propylene oxides), poly(ethylene oxides) and combinations thereof in the form of random or block copolymers and mixtures thereof having a number average molar mass between 200 and 18 000 g/mol, particularly preferably having a number average molar mass between 600 and 8000 g/mol and very particularly preferably having a number average molar mass between 1000 and 4500 g/mol.

Poly(propylene oxides) of the abovementioned functionality range, having number average molar masses between 650 g/mol and 4500 g/mol, particularly preferably having number average molar masses between 1000 g/mol and 4100 g/mol and very particularly preferably having number average molar masses between 1900 g/mol and 2100 g/mol, are particularly preferably used as A2).

In the prepolymer synthesis, isocyanate according to A1) is reacted with alcohol according to A2) in stoichiometric amounts for the urethanization, a urethane group forming. Suitable alcohols in this case for the reaction with the di-, tri- and polyisocyanates mentioned are all oligomeric or polymeric, primary or secondary, difunctional alcohols of the abovementioned type. Among the urethane prepolymers, these are preferably ethanediol, di-, tri- and tetraethylene glycol, 1,2-propanediol, di-, tri- and tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, polyethylene glycol, polypropylene glycol, block polymers and/or copolymers of ethylene oxide and propylene oxide and/or other 1-alkene oxides, poly(THF), polyester-, polycarbonate- and polyacrylatepolyols having number average molar masses up to 10 000 g/mol or any desired mixtures thereof with one another.

In the prepolymer synthesis, for the allophanatization, first an isocyanate according to A1) is reacted with an alcohol according to A2) in a stoichiometric ratio to give a urethane, which is then reacted with a further isocyanate, an allophanate forming. All oligomeric or polymeric, primary or secondary, difunctional alcohols of the above described type are suitable as an alcohol in this case for the reaction with the stated di-, tri- or polyisocyanates to give urethane. For the further reaction to the allophanate, the monomeric di- or triisocyanates HDI, TMDI and TIN are preferably added.

Preferred prepolymers are urethanes or allophanates of aliphatic isocyanate-functional compounds and oligomeric or polymeric isocyanate-reactive compounds, the prepolymers having number average molar masses of 200 to 10 000 g/mol and NCO functionalities of 1.9 to 5.0. Particularly preferred urethanes are those having NCO functionalities of 1.9 to 2.1 and number average molar masses of 650 to 8200 g/mol, prepared from aliphatic isocyanate-functional compounds and oligomeric or polymeric polyols and allophanates having functionalities greater than 2.0 to 3.2 or 3.9 to 4.2, having number average molar masses of 650 to 8200 g/mol, prepared from aliphatic isocyanate-functional compounds and oligomeric or polymeric polyols or any desired mixtures thereof. Very particularly preferred urethanes are those having NCO functionalities of 1.9 to 2.1 and number average molar masses of 1900 to 4100 g/mol, prepared from aliphatic isocyanate-functional compounds and oligomeric or polymeric polyols and allophanates having functionalities greater than 2.0 to 3.2 or 3.9 to 4.2, having number average molar masses of 1900 to 4100 g/mol, prepared from aliphatic isocyanate-functional compounds and oligomeric or polymeric polyols or any desired mixtures thereof.

Preferably, the prepolymers described above have residual contents of free monomeric isocyanate of less than 1% by weight, particularly preferably less than 0.5% by weight, very particularly preferably less than 0.2% by weight.

Of course, in addition to the described prepolymers essential to the invention, component A) may contain proportionately further isocyanates. Aromatic, araliphatic, aliphatic and cycloaliphatic di-, tri- or polyisocyanates are suitable used for this purpose. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate (TMDI), the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluylene diisocyanate, 1,5-naphthylene diisocyanate, 2,4'- or 4,4'-diphenylmethane diisocyanate, triphenylmethane 4,4',4"-triisocyanate or derivatives thereof having a urethane, urea, carbodiimide, acylurea, isocyanurate, allophanate, biuret, oxadiazinetrione, uretdione or iminooxadiazinedione structure and mixtures thereof. Polyisocyanates based on oligomerized and/or derivatized diisocyanates, which were freed from excess diisocyanate by suitable methods, in particular those of hexamethylene diisocyanate, are preferred. The oligomeric isocyanurates, uretdiones and iminooxadiazinediones of HDI and mixtures thereof are particularly preferred.

It is optionally also possible for the abovementioned isocyanate component A) completely or proportionately to contain isocyanates which are reacted completely or partly with blocking agents known to the person skilled in the art from coating technology. The following may be mentioned as an example of blocking agents: alcohols, lactams, oximes, malonic esters, alkyl acetoacetates, triazoles, phenols, imidazoles, pyrazoles and amines, such as, for example, butanone oxime, diisopropylamine, 1,2,4-triazole, dimethyl-1,2,4-triazole, imidazole, diethyl malonate, ethyl acetoacetate, acetone oxime, 3,5-dimethylpyrazole, ε-caprolactam, N-tert-butylbenzylamine, cyclopentanone carboxyethyl ester or any desired mixtures of these blocking agents.

Preferably, exclusively the above-described prepolymers essential to the invention are used in A).

Essentially all polyfunctional, isocyanate-reactive polyether polyols which preferably have on average at least 1.5 isocyanate-reactive groups per molecule can be used as component B).

In the context of the present invention, isocyanate-reactive groups are preferably hydroxy compounds.

Suitable polyfunctional, isocyanate-reactive compounds of the abovementioned type are, for example, polyester, polyether, polycarbonate, poly(meth)acrylate and/or polyurethanepolyols, preferably hydroxy-functional polyetherpolyols.

Polyetherpolyols are optionally polyadducts of cyclic ethers with OH-functional starter molecules, which polyadducts have a block structure. Suitable cyclic ethers are, for example, styrene oxides, ethylene oxide, propylene oxide, tetrahydrofuran, butylene oxide, epichlorohydrin and any desired mixtures thereof.

Polyhydric alcohols having an OH functionality of ≥2 and primary or secondary amines and amino alcohols can be used as starters. Examples of these are ethanediol, di-, tri- and tetraethylene glycol, 1,2-propanediol, di-, tri- and tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, trimethylolpropane, glycerol or any desired mixtures with one another.

Such polyetherpolyols preferably have number average molar masses of 500 to 8500 g/mol, particularly preferably of 1000 to 6500 g/mol and very particularly preferably of 1900 to 4500 g/mol. The OH functionality is preferably 1.5 to 4.0, particularly preferably 1.8 to 3.0.

In addition, component B) may also contain low molecular weight (i.e. having molecular weights of less than 500 g/mol), short-chain (i.e. containing 2 to 20 carbon atoms) aliphatic, araliphatic or cycloaliphatic di-, tri- or polyfunctional alcohols. The use of pure hydroxy-functional polyetherpolyols is preferred.

Preferred compounds of component B) are poly(propylene oxides), poly(ethylene oxides) and combinations thereof in the form of random or block copolymers and block copolymers of propylene oxide and/or ethylene oxide. The proportion of ethylene oxide, based on per cent by weight of the total product, is preferably less than 55%, particularly preferably either between 55% and 45% or less than 30% and very particularly preferably less than 10%.

Difunctional polyetherpolyols based on propylene oxide and ethylene oxide, having a proportion of ethylene oxide of less than 10% by weight, based on the total mass of the parent polyether, and a number average molar mass between 2000 and 4200 g/mol are used as very particularly preferred compounds of component B).

The components A) and B) are used in the preparation of the photopolymer formulation in an OH/NCO ratio to one another of, typically, 0.9 to 1.2, preferably 0.95 to 1.05.

In component C), urethane acrylates and/or urethane methacrylates having at least one aromatic structural unit and a refractive index greater than 1.50 at 405 nm are used. Urethane (meth)acrylates are understood as meaning compounds having at least one acrylate or methacrylate group, which additionally have at least one urethane bond. It is known that such compounds can be obtained by reacting a hydroxy-functional (meth)acrylate with an isocyanate-functional compound.

Examples of isocyanates which can be used for this purpose are aromatic, araliphatic, aliphatic and cycloaliphatic di-, tri- or polyisocyanates. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis (4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluylene diisocyanate, 1,5-naphthylene diisocyanate, 2,4'- or 4,4'-diphenylmethane diisocyanate, 1,5-naphthylene diisocyanate, triphenylmethane 4,4',4"-triisocyanate and tris(p-isocyanatophenyl) thiophosphate or the derivatives thereof having a urethane, urea, carbodiimide, acylurea, isocyanurate, allophanate, biuret, oxadiazinetrione, uretdione or iminooxadiazinedione structure and mixtures thereof. Aromatic di-, tri- or polyisocyanates are preferred.

Suitable hydroxy-functional acrylates or methacrylates for the preparation of urethane acrylates are, for example, compounds such as 2-hydroxyethyl (meth)acrylate, polyethylene oxide mono(meth)acrylates, polypropylene oxide mono (meth)acrylates, polyalkylene oxide mono(meth)acrylates, poly(ε-caprolactone) mono(meth)acrylates, such as, for example, Tone® M100 (Dow, Schwalbach, Germany), 2-hydroxypropyl(meth)acrylate, 4-hydroxybutyl(meth)acrylate, 3-hydroxy-2,2-dimethylpropyl(meth)acrylate, hydroxypropyl (meth)acrylate, 2-hydroxy-3-phenoxypropyl acrylate, the hydroxy-functional mono-, di- or tetraacrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol or industrial mixtures thereof. 2-Hydroxyethyl acrylate, hydroxypropyl acrylate, 4-hydroxybutyl acrylate and poly(ε-caprolactone) mono(meth)acrylates are preferred. Moreover, are suitable as isocyanate-reactive oligomeric or polymeric unsaturated compounds containing acrylate and/or methacrylate groups, alone or in combination with the abovementioned monomeric compounds. The epoxy (meth)acrylates known per se, containing hydroxy groups and having OH contents of 20 to 300 mg KOH/g or polyurethane (meth) acrylates containing hydroxyl groups and having OH contents of 20 to 300 mg KOH/g or acrylated polyacrylates having OH contents of 20 to 300 mg KOH/g and mixtures thereof with one another and mixtures with unsaturated polyesters containing hydroxyl groups and mixtures with polyester (meth)acrylates or mixtures of unsaturated polyesters containing hydroxyl groups with polyester (meth)acrylates can likewise be used. Epoxy acrylates containing hydroxyl groups and having a defined hydroxy functionality are preferred. Epoxy (meth)acrylates containing hydroxyl groups are based in particular on reaction products of acrylic acid and/or methacrylic acid with epoxides (glycidyl compounds) of monomeric, oligomeric or polymeric bisphenol A, bisphenol F, hexanediol and/or butanediol or the ethoxylated and/or propoxylated derivatives thereof. Epoxy acrylates having a defined functionality, as can be obtained from the known reaction of acrylic acid and/or methacrylic acid and glycidyl (meth)acrylate, are furthermore preferred.

Urethane(meth)acrylates of the abovementioned type which have at least one aromatic structural unit are preferably used. These urethane (meth)acrylates have refractive indices of, typically, greater than 1.50, preferably greater than 1.55 and very particularly preferably greater than 1.58 at 405 nm.

Particularly preferred compounds to be used as component C) are urethane acrylates and urethane methacrylates based on aromatic isocyanates and 2-hydroxyethyl acrylate, hydroxypropyl acrylate, 4-hydroxybutyl acrylate, polyethylene oxide mono(meth)acrylate, polypropylene oxide mono (meth)acrylate, polyalkylene oxide mono(meth)acrylate and poly(ε-caprolactone) mono(meth)acrylates.

In a very particularly preferred embodiment, the adducts of aromatic triisocyanates (very particularly preferably tris-(4-phenylisocyanato) thiophosphate or trimers of aromatic diisocyanates, such as toluylene diisocyanate) with hydroxyethyl acrylate, hydroxypropyl acrylate, 4-hydroxybutyl acrylate are used as component C). In a further very particularly preferred embodiment, adducts of 3-thiomethylphenyl isocyanate with hydroxyethyl acrylate, hydroxypropyl acrylate, 4-hydroxybutyl acrylate are used as component C.

Suitable compounds of component D) are, for example, inhibitors and antioxidants, as are described, for example, in "Methoden der organischen Chemie [Methods of Organic Chemistry]" (Houben-Weyl), 4$^{th}$ edition, Volume XIV/1, page 433ff, Georg Thieme Verlag, Stuttgart 1961. Suitable classes of substances are, for example, phenols, such as, for example, 2,6-di-tert-butyl-4-methylphenol, cresols, hydroquinones, benzyl alcohols, such as, for example, benzhydrol, optionally also quinones, such as, for example, 2,5-di-tert-butylquinone, optionally also aromatic amines, such as diisopropylamine or phenothiazine.

2,6-Di-tent-butyl-4-methylphenol, phenothiazine, p-methyoxyphenol, 2-methoxy-p-hydroquinone and benzhydrol are preferred.

One or more photoinitiators are used as component E). These are usually initiators which can be activated by actinic radiation and initiate a polymerization of the corresponding polymerizable groups. Photoinitiators are commercially distributed compounds known per se, a distinction being made between monomolecular (type I) and bimolecular (type II) initiators. Furthermore, depending on the chemical nature, these initiators are used for free radical, anionic (or) cationic (or mixed) forms of the abovementioned polymerizations.

Type II initiators, such as the photoinitiator systems described in EP-A 0223587 and consisting of a mixture of an ammonium arylborate and one or more dyes, are used here. For example, tetrabutylammonium triphenylhexylborate, tetrabutylammonium tris(3-fluorophenyl)hexylborate and tetrabutylammonium tris(3-chloro-4-methylphenyl)hexylborate are suitable as ammonium arylborate. Suitable dyes are, for example, new methylene blue, thionine, Basic Yellow, pinacynol chloride, rhodamine 6G, gallocyanine, ethylviolet, Victoria Blue R, Celestine Blue, quinaldine red, crystal violet, brilliant green, Astrazon Orange G, Darrow Red, pyronine Y, Basic Red 29, pyrillium I, cyanine and methylene blue, azure A (Cunningham et al., RadTech '98 North America UV/EB Conference Proceedings, Chicago, Apr. 19-22, 1998).

Preferred photoinitiators E) are mixtures of tetrabutylammonium tetrahexylborate, tetrabutylammonium triphenylhexylborate, tetrabutylammonium tris(3-fluorophenyl)hexylborate and tetrabutylammonium tris(3-chloro-4-methylphenyl)hexylborate (component E1)) with dyes, such as, for example, Astrazon Orange G, methylene blue, new methylene blue, azure A, pyrillium I, safranine O, cyanine, gallocyanine, brilliant green, crystal violet, ethyl violet and thionine (component E2)). The combination of one blue-sensitive, one green-sensitive and one red-sensitive dye each (e.g. Astrazon Orange G, ethyl violet and new methylene blue) and one of the abovementioned borate salts is particularly preferred.

Optionally one or more catalysts can be used as compounds of component F). These are catalysts for accelerating the urethane formation. Known catalysts for this purpose are, for example, tin octanoate, zinc octanoate, dibutyltin dilaurate, dimethylbis[(1-oxoneodecyl)oxy]stannane, dimethyltin dicarboxylate, zirconium bis(ethylhexanoate), zirconium acteylacetonate or tertiary amines, such as, for example, 1,4-diazabicyclo[2.2.2]octane, diazabicyclononane; diazabicycloundecane, 1,1,3,3-tetramethylguanidine, 1,3,4,6,7,8-hexahydro-1-methyl-2H-pyrimido(1,2-a)pyrimidine.

Dibutyltin dilaurate, dimethylbis[(1-oxoneodecyl)oxy] stannane, dimethyltin dicarboxylate, 1,4-diazabicyclo[2.2.2] octane, diazabicyclononane, diazabicycloundecane, 1,1,3,3-tetramethylguanidine, 1,3,4,6,7,8-hexahydro-1-methyl-2H-pyrimido(1,2-a)pyrimidine are preferred.

Of course, further additives G) can optionally be used. These may be, for example, additives customary in the area of coating technology, such as solvents, plasticizers, levelling agents, antifoams or adhesion promoters. Preferably used plasticizers are liquids having good dissolving properties, low volatility and a high boiling point. Surface-active compounds, such as, for example, polydimethylsiloxanes, can be used as levelling agents. It may also be advantageous simultaneously to use a plurality of additives of one type. Of course, it may also be advantageous to use a plurality of additives of a plurality of types.

Typical photopolymer compositions comprise:
  10 to 30% by weight of the component A),
  25 to 79.497% by weight of the component B),
  10 to 40% by weight of the component C)
  0 to 1% by weight of free radical stabilizers D)
  0.5 to 3% by weight of photoinitiators E1)
in each case 0.001 to 0.2% by weight of the three dyes E2) which are tailored in the absorption spectrum to the laser wavelengths red, green and blue
  0 to 4% by weight of catalysts F)
  0 to 10% by weight of auxiliaries and additives G)

Preferably, the polyurethane compositions according to the invention comprise
  15 to 30% by weight of the components A)
  30 to 60.96% by weight of the component B),
  20 to 35% by weight of the component C)
  0.01 to 0.5% by weight of free radical stabilizers D)
  1 to 3% by weight of photoinitiators E1)
in each case 0.01 to 0.2% by weight of the three dyes E2) which are tailored in the absorption spectrum to the laser wavelengths red, green and blue
  0 to 1% by weight of catalysts F)
  3 to 8% by weight of auxiliaries and additives G)

Particularly preferably, the polyurethane compositions according to the invention comprise
  18 to 30% by weight of component A)
  40 to 52.37% by weight of components B)
  25% by weight of the component C)
  0.02 to 0.1% by weight of free radical stabilizers D)
  1 to 1.5% by weight of photoinitiators E1)
in each case 0.03 to 0.1% by weight of the three dyes E2) which are tailored in the absorption spectrum to the laser wavelengths red, green and blue
  0.02 to 0.1% by weight of catalysts F)
  3.5 to 5% by weight of auxiliaries and additives G)

The polyurethane compositions according to the invention have viscosities at 25° C. of, typically, 10 to 100 000 mPas, preferably 100 to 20 000 mPas, particularly preferably 200 to 10 000 mPas, especially preferably 500 to 5000 mPas, immediately after complete mixing of all components, so that they have very good processing properties even in solvent-free form. In solution in suitable solvents, viscosities at 25° C. of below 10 000 mPas, preferably below 2000 mPas, particularly preferably below 500 mPas, can be established.

Polyurethane compositions of the abovementioned type which cure with a catalyst content of 0.004% by weight to 0.1% by weight at 80° C. in under 6 minutes have proved to be advantageous; concentrations between 0.01% by weight and 0.08% by weight are preferred and concentrations between 0.03% by weight and 0.06% by weight are particularly preferred.

For application to a substrate or in a mould, all respective customary methods known to the person skilled in the art are suitable, such as, in particular, knifecoating, casting, printing, screen printing, spraying or ink-jet printing. Preferably, knifecoaters and slot nozzles are suitable as application methods.

The present invention furthermore relates to photopolymers obtainable from the polyurethane formulations according to the invention and the use thereof for the production of optical articles, in particular of media suitable for recording holograms.

The present invention furthermore relates to a process for the production of such media for recording visual holograms, in which one or more of the polyurethane formulations essential to the invention are applied to a substrate or in a mould and are cured. The invention also relates to the media thus obtainable.

Such media may be film composites comprising at least one cast film or substrate layer (I), one or more photopolymer layers (II) based on the polyurethane formulations essential to the invention and a top or laminating film (III). The film composite may contain further films.

The polyurethane compositions according to the invention can be applied to the cast film or substrate layer (I) via a suitable method.

Preferred materials or material composites of the substrate layer I) are based on polycarbonate (PC), polyethylene terephthalate (PET), polybutylene terephthalate, polyethylene, polypropylene, cellulose acetate, cellulose hydrate, cellulose nitrate, cycloolefinpolymers, polystyrene, polyepoxides, polysulphone, cellulose triacetate (CTA), polyamide, polymethyl methacrylate, polyvinyl chloride, polyvinyl butyral or polydicyclopentadiene or mixtures thereof. In addition, material composites such as film laminates or coextrudates can be used as substrate film (I). Examples of material composites are duplex and triplex films having a structure according to one of the schemes A/B, A/B/A or A/B/C, such as PC/PET, PET/PC/PET and PC/TPU (TPU=thermoplastic polyurethane). PC and PET are particularly preferably used as substrate film (I).

Transparent substrates I) which are optically transparent, i.e. not hazy, are preferred. The haze is measureable via the haze value, which is less than 3.5%, preferably less than 1%, particularly preferably less than 0.3%.

The haze value describes the fraction of transmitted light which is scattered in the forward direction by the irradiated sample. Thus, it is a measure of the opacity or haze of transparent materials and quantifies material defects, particles, inhomogenieties or crystalline phase boundaries in the material or its surface which adversely affect the transparency. The method for measuring the haze is described in the standard ASTM D 1003.

Preferably, the substrate I) has a birefringence which is not too high, i.e. typically a mean optical retardation of less than 1000 nm, preferably of less than 700 nm, particularly preferably of less than 300 nm.

The retardation R is the mathematical product of the birefringence Δn and the thickness of the substrate d. The automatic and objective measurement of the retardation is effected using an imaging polarimeter, for example from ilis GmbH, StainMatic® M3/M model.

The retardation is measured in perpendicular incidence. The retardation values stated for substrate I) are lateral mean values.

The substrate I), including possible coatings on one or both sides, typically has a thickness of 5 to 2000 μm, preferably 8 to 300 μm, particularly preferably 30 to 200 μm and in particular 125 to 175 μm or 30 to 45 μm.

The photopolymer layers II) preferably have a total layer thickness, based on all photopolymer layers applied in layer II), of not more than 200 μm, particularly preferably 3 to 100 μm, very particularly preferably 15 to 60 μm.

In addition to the constituents I) and II), it is possible for the film composite have one or more covering layers III) on the photopolymer layer II) in order to protect it from dirt and environmental influences. Plastics films or film composite systems, but also clearcoats, can be used for this purpose.

Preferably used covering layers III) are film materials analogous to the materials used in the substrate layer, these a thickness of typically 5 to 200 μm, preferably 8 to 125 μm, particularly preferably 20 to 50 μm.

Covering layers III) having as smooth a surface as possible are preferred. The roughness determined according to DIN EN ISO 4288 "Geometrical Product Specification (GPS)— Surface Texture . . . ", test condition R3z front and back, is used as a measure. Preferred roughnesses are in the region of less than or equal to 2 μm, preferably less than or equal to 0.5 μm.

PE or PET films having a thickness of 20 to 60 μm are preferably used as laminating films (III); a polyethylene film of 40 μm thickness is particularly preferably used.

Further protective layers, for example a backing of the substrate film (I), may be used.

The media production method according to the invention is preferably carried out by a procedure in which the synthesis components of the polyurethane compositions according to the invention, with the exception of component A), are homogeneously mixed with one another and component A) is admixed only immediately before the application to the substrate or in the mould.

All pump systems which are known to the person skilled in the art which in particular transport independently of counter pressure, exhibit little pulsation and are precise are suitable for the transport and the required accuracy during metering. Accordingly, diaphragm pump, gear pumps, excentric screw pumps (Mohno pumps), peristaltic pumps and piston pumps are preferred. Gear pumps and excentric screw pumps (Mohno pumps) are particularly preferred.

Preferred metering rates are in the range from 2 ml/min to 1000 ml/min, particularly preferably in the range from 2 ml/min to 100 ml/min.

For mixing, all methods and apparatuses known per se to the person skilled in the art from mixing technology, such as, for example, stirred tanks and also dynamic and static mixers, can be used. However, apparatuses without dead spaces or with only small dead spaces are preferred. Furthermore, preferred methods are those in which the mixing takes place within a very short time and with very rigorous mixing of the two components to be mixed. In particular, dynamic mixers are suitable for this purpose, especially those in which the components come into contact with one another only in the mixer.

The temperatures during the procedure are 0 to 100° C., preferably 10 to 80° C., particularly preferably 20 to 60° C.

If necessary, devolatilization of the individual components or of the total mixture under a reduced pressure of, for example, 1 mbar can also be carried out. Devolatilization, in particular after addition of the component A), is preferred in order to prevent bubble formation by residual gases in the media obtainable.

Prior to admixing of the component A), the mixtures can be stored as a storage-stable intermediate product, optionally for several months.

After the admixing of the component A) of the polyurethane compositions according to the invention, a clear, liquid formulation is obtained which, depending on composition, cures at room temperature within a few seconds to a few hours.

The ratio and the type and reactivity of the synthesis components of the polyurethane compositions is preferably adjusted so that the curing after admixing of the component A) occurs within minutes to one hour at room temperature. In a preferred embodiment, the curing is accelerated by heating the formulation after the admixing to temperatures between 30 and 180° C., preferably 40 to 120° C., particularly preferably 50 to 100° C.

The abovementioned approach with regard to the curing behaviour is easily possible for a person skilled in the art easily in the form of routine experiments within the abovementioned quantity range of the components and the respective synthesis components available for choice, in particular the preferred synthesis components.

The present invention furthermore relates to the use of the media according to the invention for recording visual holograms, for the production of optical elements, images, representations and a method for recording holograms using the polyurethane compositions according to the invention, and the media or holographic films obtainable therefrom.

With the polyurethane compositions according to the invention, holograms for optical applications in the total visible range and in the near UV range (300-800 nm) can be produced by appropriate exposure processes. Visual holograms comprise all holograms which can be recorded by methods known to the person skilled in the art, including, inter alia, in-line (Gabor) holograms, off-axis holograms, full-aperture transfer holograms, white light transmission holograms ("rainbow holograms"), Denisyuk holograms, off-axis reflection holograms, edge-lit holograms and holographic stereograms; reflection holograms, Denisyuk holograms, transmission holograms are preferred. Optical elements, such as lenses, mirrors, deflecting mirrors, filters, diffusion screens, diffraction elements, light conductors, waveguides, projection screens and/or masks have are preferred. Frequently, these optical elements show a frequency selectivity depending on how the holograms were exposed and which dimensions the hologram has.

Moreover, holographic images or representations, such as, for example, for personal portraits, biometric representations and security documents, or generally of images or image structures for advertising, security labels, trademark protection, trademark branding, labels, design elements, decorations, illustrations, reward cards, images and the like and images which may represent digital data, inter alia also in combination with the products described above, can also be produced by means of the polyurethane compositions according to the invention. Holographic images can give the impression of a three-dimensional image, but they may also represent image sequences, short films or a number of different objects, depending on the angle from which said objects are exposed, the light source used for the exposure (including moving ones), etc. Owing to this variety of potential designs, holograms, in particular volume holograms, are an attractive technical solution for the abovementioned application.

All the references described above are incorporated by reference in their entireties for all useful purposes.

While there is shown and described certain specific structures embodying the invention, it will be manifest to those skilled in the art that various modifications and rearrangements of the parts may be made without departing from the spirit and scope of the underlying inventive concept and that the same is not limited to the particular forms herein shown and described.

EXAMPLES

Starting Materials:

Desmodur XP 2599 is an experimental product from Bayer MaterialScience AG, Leverkusen, Germany, full allophanate of hexane diisocyanate on Acclaim 4200, NCO content: 5.6-6.4%

Prepolymer 1 is an experimental product of Bayer MaterialScience AG, Leverkusen, Germany, urethane of hexane diisocyanate and Acclaim 2200, NCO content: 3.2-3.75%

Polyol 1 (Acclaim® 4200) is a polypropylene oxide having a number average molar mass of 4000 g/mol from Bayer MaterialScience AG, Leverkusen, Germany.

Polyol 2 (Acclaim® 4220 N) is an ethylene oxide-capped polypropylene oxide having a number average molar mass of 4000 g/mol from Bayer MaterialScience AG, Leverkusen, Germany.

Polyol 3 (Acclaim® 2200) is a polypropylene oxide having a number average molar mass of 2000 g/mol from Bayer MaterialScience AG, Leverkusen, Germany.

Urethane acrylate 1 is an experimental product from Bayer MaterialScience AG, Leverkusen, Germany, urethane acrylate based on HEA and tris(p-isocyanatophenyl)thiophosphate.

Fomrez® UL28: urethanization catalyst, dimethylbis[(1-oxoneodecl)oxy]stannane, commercial product from Momentive Performance Chemicals, Wilton, Conn., USA (used as 10% strength solution in N-ethylpyrrolidone).

CGI 909: borate-based coinitiator from Ciba Inc., Basel, Switzerland.

New methylene blue (zinc-free): dye from Sigma-Aldrich Chemie GmbH, Steinheim, Germany.

Ethyl violet: dye from MP Biomedicals LLC, Solon, Ohio, USA.

Astrazon Orange G: dye from Sigma-Aldrich Chemie GmbH, Steinheim, Germany.

Byk 310: silicone-based surface additive from BYK-Chemie GmbH, Wesel, Germany (about 25% strength solution in xylene), number average molar mass about 2200 g/mol.

Measurement of Diffraction Efficiency DE and Refractive Index Contrast $\Delta n$:

The media according to the invention produced in the experimental section and comparative media were tested with regard to their holographic properties by means of a measuring arrangement according to FIG. 1:

FIG. 1: geometry of a holographic media tester at $\lambda$=633 nm (He—Ne laser) for writing a reflection hologram: M=mirror, S=shutter, SF=spatial filter, CL=collimeter lens, $\lambda/2$=$\lambda/2$ plate, PBS=polarization-sensitive beam splitter, D=detector, I=iris diaphragm, $\alpha$=21.8° and $\beta$=41.8° are the angles of incidence of the coherent beams, measured outside the sample (outside the medium).

The laminating film is peeled off the film composite, and the photopolymer material is then laminated onto glass in such a way that the substrate film faces outwards.

The beam of an He—Ne laser (emission wavelength 633 nm) was converted with the aid of the spatial filter (SF) and together with the collimation lens (CL) into a parallel homogeneous beam. The final cross sections of the signal and reference beam are established by the iris diaphragms (I). The diameter of the iris diaphragm opening is 4 mm. The polarization-dependent beam splitters (PBS) split the laser beam into two coherent equally polarized beams. Via the $\lambda/2$ plates, the power of the reference beam was adjusted of 0.5 mW and the power of the signal beam to 0.65 mW. The powers were determined using the semiconductor detectors (D) with sample removed. The angle of incidence ($\alpha$) of the reference beam is 21.8° and the angle of incidence ($\beta$) of the signal beam is 41.8°. At the location of the sample (medium), the interference field of the two overlapping beams produced a grating of light and dark strips which are perpendicular to the angle bisectors of the two beams incident on the sample (reflection hologram). The strip spacing in the medium is ~225 nm (refractive index of the medium assumed to be ~1.49).

Holograms were written into the medium in the following manner:

Both shutters (S) are opened for the exposure time t. Thereafter, with the shutters (S) closed, the medium was allowed a time of 5 minutes for diffusion of the still unpolymerized writing monomers. The holograms written were now read in the following manner. The shutter of the signal beam remained closed. The shutter of the reference beam was opened. The iris diaphragm of the reference beam was closed to a diameter of <1 mm. This ensured that the beam was always completely in the previously written hologram for all angles ($\Omega$) of rotation of the medium. The turntable, under computer control, now covered the angle range from $\Omega$=0° to $\Omega$=20° with an angle step width of 0.05°. At each angle approached, the powers of the beam transmitted in the zeroth order were measured by means of the corresponding detector D and the powers of the beam diffracted in the first order were measured by means of the detector D. The diffraction deficiency $\eta$ was obtained at each angle $\Omega$ approached as the quotient of:

$$\eta = \frac{P_D}{P_D + P_T}$$

$P_D$ is the power in the detector of the diffracted beam and $P_T$ is the power in the detector of the transmitted beam.

By means of the method described above, the Bragg curve (it describes the diffraction efficiency η as a function of the angle Ω of rotation of the written hologram) was measured and was stored in a computer. In addition, the intensity transmitted in the zeroth order was also plotted against the angle Ω of rotation and stored in a computer.

The maximum diffraction efficiency (DE=$\eta_{max}$) of the hologram, i.e. its peak value, was determined. It may have been necessary for this purpose to change the position of the detector of the diffracted beam in order to determine this maximum value.

The refractive index contrast Δn and the thickness d of the photopolymer layer was now determined by means of the coupled wave theory (cf. H. Kogelnik, The Bell System Technical Journal, Volume 48, November 1969, Number 9 page 2909-page 2947) from the measured Bragg curve and the variation of the transmitted intensity as a function of angle. The method is described below:

According to Kogelnik, the following is true for the Bragg curve η/(Ω) of a reflection hologram:

$$\eta = \frac{1}{1 + \frac{1 - (\chi/\Phi)^2}{\sinh^2(\sqrt{\Phi^2 - \chi^2})}}$$

where:

$$\Phi = \frac{\pi \cdot \Delta n \cdot d}{\lambda \cdot \sqrt{\cos(\alpha') \cdot \cos(\alpha' - 2\psi)}}$$

$$\chi = \Delta\theta \cdot \frac{2\pi \cdot \sin(\alpha' - \psi)}{\Lambda \cdot \cos(\alpha' - 2\psi)} \cdot \frac{d}{2}$$

$$\psi = \frac{\beta' - \alpha'}{2}$$

$$\Lambda = \frac{\lambda}{2 \cdot n \cdot \cos(\psi - \alpha')}$$

$$n \cdot \sin(\alpha') = \sin(\alpha), \, n \cdot \sin(\beta') = \sin(\beta)$$

$$\Delta\theta = -\Delta\Omega \cdot \sqrt{\frac{1 - \sin^2(\alpha)}{n^2 - \sin^2(\alpha)}}$$

Φ is the grating thickness, x is the detuning parameter and Ψ is the angle of tilt of the refractive index grating which was written. α' and β' correspond to the angles α and β during writing of the hologram, but in the medium. ΔΘ is the angle detuning measured in the medium, i.e. the deviation from the angle α'. ΔΩ is the angle detuning measured outside the medium, i.e. the deviation from the angle α. n is the average refractive index of the photopolymer and was set at 1.504.

The maximum diffraction efficiency (DE=$\eta_{max}$) is then obtained for χ=0, i.e. ΔΩ=0 as:

$$DE = \tanh^2(\Phi) = \tanh^2\left(\frac{\pi \cdot \Delta n \cdot d}{\lambda \cdot \sqrt{\cos(\alpha') \cdot \cos(\alpha' - 2\Psi)}}\right)$$

Figure 2:
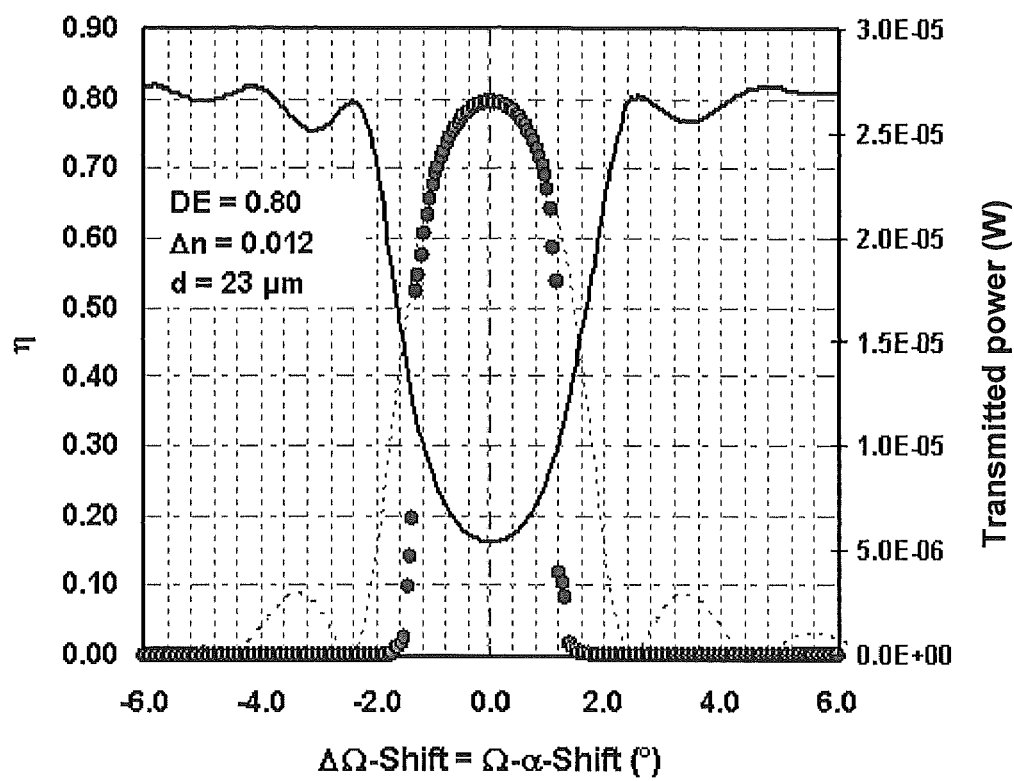
FIG. 2 depicts the plot of the Bragg curve ii according to Kogelnik (dashed line), of the measured diffraction efficiency (solid circles) and of the transmitted power (black solid line) against the angle detuning ΔΩ.

The measured data of the diffraction efficiency, the theoretical Bragg curve and the transmitted intensity are shown in FIG. 2 plotted against the centred angle of rotation Ω-α shift. Since, owing to the geometric shrinkage and the change in the average refractive index during the photopolymerization, the angle at which DE is measured differs from α, the x axis is centred around this shift. The shift is typically 0° to 2°.

Since DE is known, the shape of the theoretical Bragg curve according to Kogelnik is determined only by the thickness d of the photopolymer layer. Δn is subsequently corrected via DE for a given thickness d so that measurement and theory of DE always agree. d is now adapted until the angle positions of the first secondary minima of the theoretical Bragg curve agree with the angle positions of the first secondary maxima of the transmitted intensity and additionally the full width at half maximum (FWHM) for the theoretical Bragg curve and the transmitted intensity agree.

Since the direction in which a reflection hologram concomitantly rotates on reconstruction by means of an Ω scan, but the detector for the diffracted light can detect only a finite angle range, the Bragg curve of broad holograms (small d) is not completely detected in an Ω scan, but only the central region, with suitable detector positioning. That shape of the transmitted intensity which is complementary to the Bragg curve is therefore additionally used for adapting the layer thickness d.

FIG. 2: plot of the Bragg curve η according to Kogelnik (dashed line), of the measured diffraction efficiency (solid circles) and of the transmitted power (black solid line) against the angle detuning ΔΩ. Since, owing to geometric shrinkage and the change of the average refractive index during the photopolymerization, the angle at which DE is measured differs from α, the x axis is centred around this shift. The shift is typically 0° to 2°.

For a formulation, this procedure was possibly repeated several times with different exposure times t on different media in order to determine the average energy dose of the incident laser beam at which DE reaches the saturation value during writing of the hologram. The average energy dose E is obtained as follows:

$$E(mJ/cm^2) = \frac{2 \cdot [0.50 \text{ mW} + 0.67 \text{ mW}] \cdot t(s)}{\pi \cdot 0.4^2 \text{ cm}^2}$$

The powers of the part-beams were adapted so that the same power density is achieved in the medium at the angles α and β used.

Alternatively, a test equivalent to the setup shown in FIG. 1 was also carried out using a green laser with the emission wavelength λ in a vacuum of 532 nm. Here, α=11.5° and β=33.5° and $P_\alpha$=1.84 mW and $P_\beta$=2.16 mW.

Preparation of the Urethane Acrylate 1:

0.1 g of 2,6-di-tert-butyl-4-methylphenol, 0.05 g of dibutyltin dilaurate (Desmorapid Z, Bayer MaterialScience AG, Leverkusen, Germany) and 213.07 g of a 27% strength solution of tris(p-isocyanatophenyl)thiophosphate in ethyl acetate (Desmodur® RFE, product of Bayer MaterialScience AG, Leverkusen, Germany) were initially introduced into a 500 ml round-bottomed flask and heated to 60° C. Thereafter, 42.37 g of 2-hydroxyethyl acrylate were added dropwise and the mixture was further kept at 60° C. until the isocyanate content had fallen below 0.1%. Thereafter, cooling was effected and the ethyl acetate was completely removed in vacuo. The product was obtained as a semicrystalline solid.

For the production of the holographic media, the component C, the component D (which may already have been predissolved in the component C) and optionally the components G and F are dissolved in the component B, optionally at 60° C., and thoroughly mixed. Thereafter, the component E in pure form or in dilute solution in NEP is weighed in in the dark or under suitable illumination and mixing is effected again. Optionally, heating is effected to 60° C. for not more than 10 minutes in a drying oven. The mixture obtained can be devolatilized with stirring at <10 mbar.

The component A can likewise be devolatilized with stirring at <10 mbar. The two formulations are then metered continuously by means of positive metering pumps via one of the abovementioned mixing methods and are mixed. The mixture is then applied continuously and homogeneously to a substrate via an application unit, such as, for example, a knifecoater or a slot nozzle.

The coated substrates are dried at about 80° C. and then covered with one of the abovementioned covering layers and packed in a light-tight packaging.

The thickness d of the photopolymer layer results from the coating parameters of the corresponding coating device, which are known to the person skilled in the art.

The following examples are mentioned for illustrating the method according to the invention but are not to be understood as being limiting. Unless noted otherwise, all stated percentages of the photopolymers are based on per cent by weight.

Example 1

13.75 g of urethane acrylate 1 (component C), then 0.275 g of Fomrez® UL 28 (component F) and 0.165 g of Byk 310 (component G) and finally a solution of 0.825 g of CGI 909, 0.028 g of new methylene blue, 0.028 g of ethyl violet and 0.028 g of Astrazon Orange G (together component E) in 1.678 g of N-ethylpyrrolidone (component G) were added stepwise to 27.83 g of polyol 1 (component B) in the dark and mixing was effected so that a clear solution was obtained. Thereafter, 10.395 g of Desmodur XP 2599 (component A) were added at 30° C. and mixing was effected again. The liquid material obtained was then applied to a 175 μm thick polycarbonate film and dried for 4.5 minutes at 80° C. Dry layer thickness: 45 μm, maximum Δn: 0.016 (633 nm); 0.017 (532 nm).

Example 2

5.00 g of urethane acrylate 1 (component C), then 0.100 g of Fomrez® UL 28 (component F) and 0.060 g of Byk 310 (component G) and finally a solution of 0.300 g of CGI 909, 0.010 g of new methylene blue, 0.010 g of ethyl violet and 0.010 g of Astrazon Orange G (together component E) in 0.610 g of N-ethylpyrrolidone (component G) were added stepwise to 10.245 g of polyol 2 (component B) in the dark and mixing was effected so that a clear solution was obtained. Thereafter, 3.655 g of Desmodur® XP 2599 (component A) were added at 30° C. and mixing was effected again. The liquid material obtained was then applied to a 175 μm thick polycarbonate film and dried for 4.5 minutes at 80° C. Dry layer thickness: 25 μm, maximum Δn: 0.012 (633 nm); 0.010 (532 nm).

Example 3

13.75 g of urethane acrylate 1 (component C), then 0.275 g of Fomrez® UL 28 (component F) and 0.165 g of Byk 310 (component G) and finally a solution of 0.825 g of CGI 909, 0.028 g of new methylene blue, 0.028 g of ethyl violet and 0.028 g of Astrazon Orange G (together component E) in 1.678 g of N-ethylpyrrolidone (component G) were added stepwise to 19.946 g of polyol 3 (component B) in the dark and mixing was effected so that a clear solution was obtained. Thereafter, a mixture of 6.467 g of Desmodur® XP 2599 and 11.812 g of prepolymer 1 (together component A) were added at 30° C. and mixing was effected again. The liquid material obtained was then applied to a 175 μm thick polycarbonate film and dried for 4.5 minutes at 80° C. Dry layer thickness: 32 μm, maximum Δn: 0.016 (633 nm); 0.017 (532 nm).

Example 4

5.00 g of urethane acrylate 1 (component C), then 0.100 g of Fomrez® UL 28 (component F) and 0.060 g of Byk 310 (component G) and finally a solution of 0.300 g of CGI 909, 0.010 g of new methylene blue, 0.010 g of ethyl violet and 0.010 g of Astrazon Orange G (together component E) in 0.610 g of N-ethylpyrrolidone (component G) were added stepwise to 8.432 g of polyol 3 (component B) in the dark and mixing was effected so that a clear solution was obtained. Thereafter, 5.468 g of Desmodur® XP 2599 (component A) were added at 30° C. and mixing was effected again. The liquid material obtained was then applied to a 36 μm thick polyethylene terephthalate film and dried for 4.5 minutes at 80° C. Dry layer thickness: 30 μm, maximum Δn: 0.013 (633 nm); 0.014 (532 nm).

The invention claimed is:

1. A polyurethane composition comprising
   A) a polyisocyanate component comprising an NCO-terminated polyurethane prepolymer, wherein the NCO groups of said NCO-terminated polyurethane prepolymer are primarily aliphatically bonded and wherein said NCO-terminated polyurethane prepolymer is based on hydroxy-functional compounds having an OH functionality of from 1.6 to 2.05;
   B) an isocyanate-reactive polyetherpolyol;
   C) a urethane acrylate and/or urethane methacrylate comprising at least one aromatic structural unit and a refractive index of greater than 1.50 at 405 nm, wherein said urethane acrylate and/or urethane methacrylate is free of NCO groups and OH groups;
   D) a free radical stabilizer;
   E) a photoinitiator based on a combination of a borate salt and a dye having an absorption band which at least partly covers the spectral range of from 400 to 800 nm;
   F) optionally a catalyst; and
   G) optionally an auxiliary and/or an additive.

2. The polyurethane composition of claim 1, wherein said NCO-terminated polyurethane prepolymer comprises one or more urethane, allophanate, biuret, and/or amide groups.

3. The polyurethane composition of claim 1, wherein said NCO-terminated polyurethane prepolymer is a urethane or allophanate of an aliphatic isocyanate-functional compound and an oligomeric or polymeric polyol, wherein said urethane or allophanate has a number average molar mass in the range of from 650 to 8200 g/mol and an NCO functionality of from 2.0 to 3.2 or of from 3.9 to 4.2.

4. The polyurethane composition of claim 1, wherein said NCO-terminated polyurethane prepolymer is an allophanate of HDI and a difunctional polyetherpolyol, wherein said allophanate has number average molar mass in the range of from 1900 to 4100 g/mol and an NCO functionality of from 2.0 to 3.2 or of from 3.9 to 4.2.

5. The polyurethane composition of claim 1, wherein said NCO-terminated polyurethane prepolymer has a residual content of free monomeric isocyanate of less than 0.5% by weight.

6. The polyurethane composition of claim 1, wherein B) comprises a poly(propylene oxide), a poly(ethylene oxide), or a combination thereof in the form of random or block copolymers.

7. The polyurethane composition of claim 1, wherein B) comprises a difunctional polyetherpolyol based on propylene oxide and ethylene oxide, wherein the proportion of ethylene oxide is less than 10% by weight, based on the total weight of said polyetherpolyol, and wherein said difunctional polyetherpolyol has a number average molar mass in the range of from 2000 to 4200 g/mol.

8. The polyurethane composition of claim 1, wherein said urethane acrylate and/or urethane methacrylate has a refractive index $n_D^{20}$ of greater than 1.55.

9. The polyurethane composition of claim 1, wherein said urethane acrylate and/or urethane methacrylate is based on (1) an aromatic isocyanate and (2) 2-hydroxyethyl acrylate, hydroxypropyl acrylate, 4-hydroxybutyl acrylate, a polyethylene oxide mono(meth)acrylate, a polypropylene oxide mono(meth)acrylate, a polyalkylene oxide mono(meth)acrylate, or a poly(ε-caprolactone) mono(meth)acrylate.

10. The polyurethane composition of claim 1, wherein E) is a mixture of E1) and E2, wherein E1) is selected from the group consisting of tetrabutylammonium tetrahexylborate, tetrabutylammonium triphenylhexylborate, tetrabutylammonium tris(3-fluorophenyl)hexylborate, and tetrabutylammonium tris(3-chloro-4-methylphenyl)hexylborate and E2) is selected from the group consisting of Astrazon Orange G, methylene blue, new methylene blue, azure A, pyrillium I, safranin O, cyanine, gallocyanine, brilliant green, crystal violet, ethyl violet, and thionine.

11. A process for producing a medium for recording visual holograms comprising applying the polyurethane composition of claim 1 to a substrate or in a mould and curing said polyurethane composition.

12. A medium for recording visual holograms produced by the process of claim 11.

13. An optical element or image comprising the medium of claim 11.

\* \* \* \* \*